(12) United States Patent
Chang et al.

(10) Patent No.: US 9,590,302 B2
(45) Date of Patent: Mar. 7, 2017

(54) ACTIVE ANTENNA MODULE

(71) Applicant: U&U Engineering Inc., Taipei (TW)

(72) Inventors: Chi-Ho Chang, Taipei (TW); Ren-Her Chen, Taipei (TW); Ping-Chang Tsao, Taipei (TW); Jen-Chih Huang, Taipei (TW); Guo-Zhong Lu, Taipei (TW); Yun-Chun Sung, Taipei (TW)

(73) Assignee: U&U ENGINEERING INC., Taipei (TW)

( * ) Notice: Subject to any disclaimer, the term of this patent is extended or adjusted under 35 U.S.C. 154(b) by 444 days.

(21) Appl. No.: 13/975,337

(22) Filed: Aug. 25, 2013

(65) Prior Publication Data
US 2015/0015452 A1 Jan. 15, 2015

(30) Foreign Application Priority Data

Jul. 10, 2013 (TW) .............................. 102124685 A

(51) Int. Cl.
| | | |
|---|---|---|
| *H01Q 23/00* | (2006.01) | |
| *H01Q 7/00* | (2006.01) | |
| *H01Q 1/32* | (2006.01) | |
| *H03F 3/191* | (2006.01) | |
| *H03F 3/60* | (2006.01) | |

(52) U.S. Cl.
CPC .............. *H01Q 7/00* (2013.01); *H01Q 1/3233* (2013.01); *H01Q 23/00* (2013.01); *H03F 3/191* (2013.01); *H03F 3/60* (2013.01); *H03F 2200/294* (2013.01)

(58) Field of Classification Search
CPC . H01Q 23/00; H01Q 1/50; H01Q 7/00; H03F 3/60; H03F 3/189

USPC ........ 343/722, 850, 855, 860, 741, 866, 895
See application file for complete search history.

(56) References Cited

U.S. PATENT DOCUMENTS

| | | | | |
|---|---|---|---|---|
| 4,380,828 A | * | 4/1983 | Moon ..................... | H03D 7/125 455/319 |
| 4,393,514 A | | 7/1983 | Minakuchi et al. | |
| 5,097,227 A | | 3/1992 | Yuan et al. | |
| 5,469,180 A | | 11/1995 | Wiggenhorn | |
| 5,583,523 A | * | 12/1996 | Wallace, Jr. ............. | H01Q 7/00 343/700 MS |
| 7,764,236 B2 | * | 7/2010 | Hill ........................ | H01Q 1/243 343/702 |
| 8,917,160 B2 | | 12/2014 | Tsushima et al. | |
| 2008/0231526 A1 | * | 9/2008 | Sato ......................... | H01P 1/15 343/722 |

(Continued)

FOREIGN PATENT DOCUMENTS

CN          102693443 A          9/2012

*Primary Examiner* — Dameon E Levi
*Assistant Examiner* — Hasan Islam
(74) *Attorney, Agent, or Firm* — JMB Davis Ben-David

(57) ABSTRACT

An active antenna module is disclosed. The active antenna module comprises a loop antenna, a RF transistor, a LR series circuit, a first bypass capacitor and a second bypass capacitor. The RF transistor comprises a control port, a first port, and a second port. Each of two ends of the loop antenna is electrically connected to one of the control port and the second port, and the control port and the second port are out of phase. The second port is electrically connected to the first port via the first bypass capacitor. The first port is electrically connected to ground via the LR series circuit. The second bypass capacitor and a resistor of the LR series circuit are connected in parallel.

18 Claims, 6 Drawing Sheets

(56) References Cited

U.S. PATENT DOCUMENTS

2008/0258731 A1* 10/2008 Smith .................... H01Q 7/005
324/322
2013/0002512 A1* 1/2013 Leighton .................. H01Q 7/08
343/867

* cited by examiner

ACTIVE ANTENNA MODULE

CROSS REFERENCE TO RELATED APPLICATION

This application claims priority to Taiwan Application Serial Number 102124685, filed on Jul. 10, 2013, which is herein incorporated by reference.

BACKGROUND OF THE INVENTION

1. Field of the Invention

The present invention relates to a radio frequency sensor structure, more particularly, to an active radio frequency sensor structure having a self-mixing and self-demodulation architecture.

2. Description of the Related Art

From ancient times, the continued development of means of transportation has been one of the driving forces for human civilization. The evolution of various means of transportation illustrates the necessary role that they have played in pushing forward human civilization. As technology continues to progress, nowadays vehicle performance gets better and better, human mobility becomes faster and faster, and more and more road conditions dynamically occur. A variety of different automotive electronics products having different road traffic monitoring functions emerge.

The conventional microwave/radio frequency sensor is to independently design the antenna and the transceiver module. Please refer to FIG. 1, FIG. 1 is a schematic diagram showing a structure of a microwave radio frequency sensor according to the prior art. The prior art microwave/radio frequency sensor 10 comprises a demodulation circuit 11, a voltage controlled oscillator 12, a power divider 13, a driving amplifier 14, a transmitting antenna 15, a receiving antenna 16, a low noise amplifier 17, and a mixer 18. The demodulation circuit 11 is used for generating the required demodulated signal, and emitting the demodulated signal to the voltage controlled oscillator 12. The voltage controlled oscillator 12 is an electronic oscillating circuit which controls the oscillation frequency in accordance with the input voltage and finally outputs the frequency modulated continuous wave. The transmitting antenna 15 then emits a transmitted wave to the road. However, before the frequency modulated continuous wave passing the transmitting antenna 15, the power divider 13 will input a portion of the power output from the voltage controlled oscillator 12 to the mixer 18 so as to obtain an intermediate frequency signal. The driving amplifier 14 will amplify the frequency modulated continuous wave before the transmitting antenna 15 receives the frequency modulated continuous wave.

The receiving antenna 16 will input the received signal to the mixer 18 after receiving the echo signal. Before the signal is transmitted to the mixer 18, the low noise amplifier 17 will not only amplify the signal but also inhibit noise to allow subsequent electronic components performing signal processing. The mixer 18 then calculates the frequency difference between the transmitted wave and the echo wave, down converts the frequency difference and outputs the intermediate frequency signal. After that, the back-end intermediate frequency circuit (not shown in the figure) regulates the range of detection distance (range measurement) to obtain the information of the detection target. Finally, the analog signal is converted to the digital signal and sent to the digital signal processor (not shown in the figure). The object recognition is performed to achieve the objective of traffic monitoring.

As mentioned previously, the antenna and the radio frequency circuit module are first independently designed then integrated according to the prior art. A dual-antenna architecture is generally adopted in system design so that the isolation between the transmitting path and the receiving path is increased. When considering the size of system, the architecture having a single antenna cooperating with a circulator is adopted to isolate the transmitting path from the receiving path. Nevertheless, the prior art has its limitation in applications. When the prior art is applied to low-cost, small-sized (diameter is smaller than 2 cm), and low power consumption (power consumption is less than 1.5 W) products that are used for detecting moving objects at a short distance (within 20 m) and having a wide coverage angle (approximately 360 degree, that is omnidirectional), the following problems are encountered.

Both the above-mentioned dual-antenna and single-antenna architectures perform detecting based on standard radar principle. In other words, the power level is a major reference for the range measurement. At the same time, the size of the antenna is directly related to the operating frequency. When the operating frequency is lower, the antenna size is larger but the 3 dB beamwidth is larger to result in a wide detection range. Conversely, when the operating frequency is higher, the antenna size is smaller but the 3 dB beamwidth is smaller to result in a narrow detection range. Because the adoption of dual-antenna would increase the volume, it is very inappropriate to typical small-sized sensors when the dual-antenna architecture is utilized. But if the carrier frequency is increased, the 3 dB beamwidth of the antenna becomes smaller, which is inappropriate to the detection of moving objects in a wide-angle environment. When the single-antenna architecture is adopted, although its volume is smaller than that of the dual-antenna architecture, its cost is higher than that of the dual-antenna architecture owing to the implementing of the circulator. Moreover, the highest reverse path isolation is only 35 dB that is significantly lower than that of the dual-antenna architecture. In addition, it is impossible to add a power amplifier or other unidirectional element at the transmitting path.

It is therefore very important to design a new active radio frequency sensor structure that integrates the antenna and the transceiver circuit together so as to satisfy the demand for miniaturization.

SUMMARY OF THE INVENTION

The present invention provides a radio frequency sensor structure to integrate an antenna and a transceiver circuit to resolve the above-mentioned problems.

The present invention provides an active antenna module. The active antenna module comprises a loop antenna, a radio frequency transistor, a first bypass capacitor, an inductor-resistor series circuit, and a second bypass capacitor. The radio frequency transistor comprises a control port, a first port, and a second port. Each of two ends of the loop antenna is electrically connected to one of the control port and the second port. The control port and the second port are out of phase. The second port is electrically connected to the first port via the first bypass capacitor. The first port is electrically connected to a ground terminal via the inductor-resistor series circuit. The second bypass capacitor and a resistor of the inductor-resistor series circuit are connected in parallel.

According to one embodiment of the present invention, the radio frequency transistor is a bipolar junction transistor.

According to one embodiment of the present invention, the control port is a base, the first port is an emitter, and the second port is a collector.

According to one embodiment of the present invention, the radio frequency transistor is a field effect transistor, and the field effect transistor comprises a pseudomorphic high electron mobility transistor.

According to one embodiment of the present invention, the control port is a gate, the first port is a source, and the second port is a drain.

According to one embodiment of the present invention, the first port is a port for down conversion used for outputting a demodulation signal.

According to one embodiment of the present invention, one end of the first bypass capacitor is electrically connected to the second port, and the other end of the first bypass capacitor is electrically connected to the first port.

According to one embodiment of the present invention, one end of the second bypass capacitor is electrically connected to the resistor of the inductor-resistor series circuit, and the other end of the second bypass capacitor is electrically connected to the ground terminal.

The present invention further provides an active antenna module. The active antenna module comprises a first microstrip antenna metal sheet, a second microstrip antenna metal sheet, a third microstrip antenna metal sheet, a substrate, a first coupling metal sheet, a second coupling metal sheet, a third coupling metal sheet, and a radio frequency transistor. The first microstrip antenna metal sheet, the second microstrip antenna metal sheet, and the third microstrip antenna metal sheet are disposed on a first surface of the substrate. The first coupling metal sheet is disposed on a second surface of the substrate. The second surface is opposite to the first surface. The second coupling metal sheet is disposed on the second surface. The third coupling metal sheet is disposed on the second surface. The radio frequency transistor is disposed on the first surface. The radio frequency transistor comprises a control port, a first port, and a second port. The control port is connected to the third microstrip antenna metal sheet. The first port and the second port are respectively connected to the first coupling metal sheet and the first microstrip antenna metal sheet. A first portion of the first microstrip antenna metal sheet and the first coupling metal sheet form an equivalent bypass capacitor. A second portion of the first microstrip antenna metal sheet, a first portion of the second microstrip antenna metal sheet adjacent to the second portion of the first microstrip antenna metal sheet, and the second coupling metal sheet form a first equivalent coupling capacitor. A second portion of the second microstrip antenna metal sheet, and portions of the third microstrip antenna metal sheet adjacent to the second portion of the second microstrip antenna metal sheet, and the third coupling metal sheet form a second equivalent coupling capacitor.

According to one embodiment of the present invention, the first microstrip antenna metal sheet, the second microstrip antenna metal sheet, the third microstrip antenna metal sheet, the substrate, the first coupling metal sheet, the second coupling metal sheet, and the third coupling metal sheet constitute a loop antenna.

According to one embodiment of the present invention, the radio frequency transistor is a bipolar junction transistor.

According to one embodiment of the present invention, the control port is a base, the first port is an emitter, and the second port is a collector.

According to one embodiment of the present invention, the radio frequency transistor is a field effect transistor, and the field effect transistor comprises a pseudomorphic high electron mobility transistor.

According to one embodiment of the present invention, the control port is a gate, the first port is a source, and the second port is a drain.

In contrast to the prior art, the present invention radio frequency sensor structure sufficiently resolves the problems of prior art, and is very ideal when applying to small-sized sensors used for detecting moving objects at a short distance but having a wide coverage angle. Since the radio frequency module and the antenna of the radio frequency sensor structure are integrated together, the antenna therefore has the functions of the oscillator and the feedback circuit to simplify the radio frequency transceiver. Furthermore, the voltage controlled oscillator and the mixer are replaced by a BJT or a FET (for example: P-Hemt), both volume and power consumption rate are obviously improved. Moreover, the design approach of the present invention is to take advantage of the high sensitivity rather than designing the traditional radar antenna system having high gain and high power, so the electromagnetic radiation power is reduced, and may be less than −10 dB. The interferences to other communication and radar systems are thus small. In addition, since the antenna is integrated with the radio frequency circuit comprising the oscillating circuit, the mixing and demodulation circuit, at least one active component such as a radio frequency transistor must be disposed on the antenna. Hence, the length of the radio frequency oscillation loop is compensated by adjusting the phase of the radio frequency transistor to allow the frequency unchanged when the antenna size is miniaturized. At the same time, the operating frequency is maintained within the low frequency band so the 3 dB beamwidth is not made small, which is appropriate to the detection of moving objects having a wide coverage angle.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The main concept of the present invention is to integrate the transmitting antenna, the receiving antenna, and the transceiver circuit together, and the radio frequency circuit further comprises an oscillating circuit and a mixing and demodulation circuit. Therefore, at least one active component such as a radio frequency transistor must be disposed on the antenna so that the physical antenna also has the functions of an oscillator and a feedback circuit to form the so-called active antenna.

Figure 1:
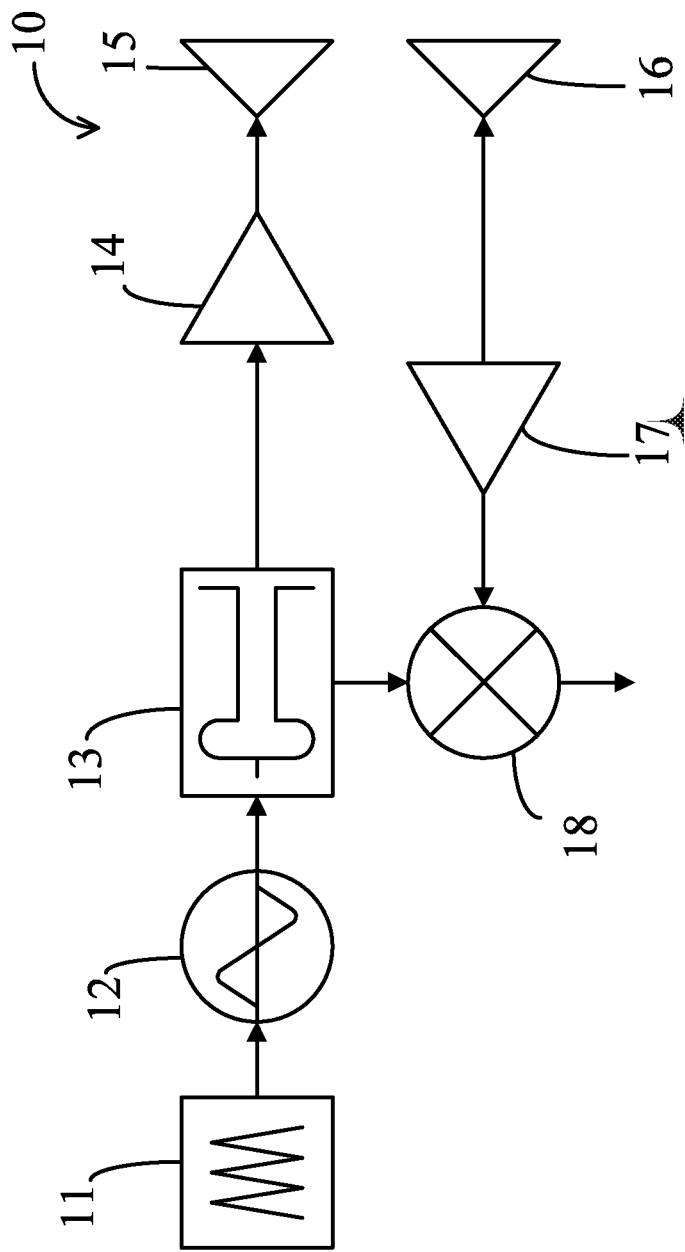
FIG. 1 is a schematic diagram showing a structure of a conventional microwave/radio frequency sensor.
Figure 2:
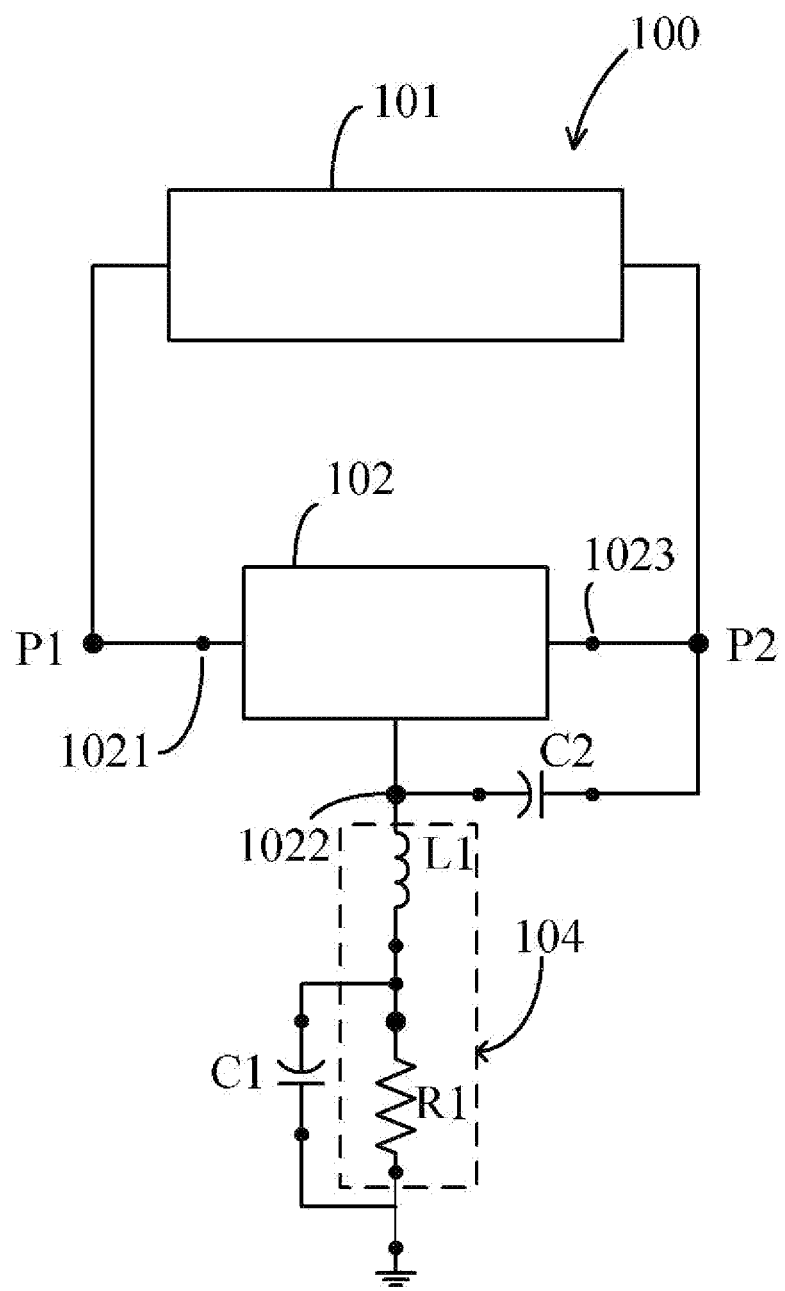
FIG. 2 is an equivalent circuit of an active antenna module according to the present invention.

Please refer to FIG. 2, FIG. 2 is an equivalent circuit of an active antenna module according to a preferred embodiment of the present invention. The active antenna module 100, having a self-mixing and self-demodulation architecture, comprises a loop antenna 101 and a radio frequency transistor 102. In practical design of the active antenna module 100, the largest possible circular diameter of the loop antenna 101 must first be decided because it is applied in miniaturized products with limited space. Then the radio frequency transistor 102 is selected and the equivalent capacitance values and equivalent inductance values contributed by the metal sheets are adjusted to obtain the optimized detection capability. The radio frequency transistor 102, based on practical requirements, may be a bipolar junction transistor (BJT) or a field effect transistor (FET). Under the circumstances of FET, the radio frequency transistor 102 is, for example, a pseudomorphic high electron mobility transistor (P-Hemt).

Figure 3:
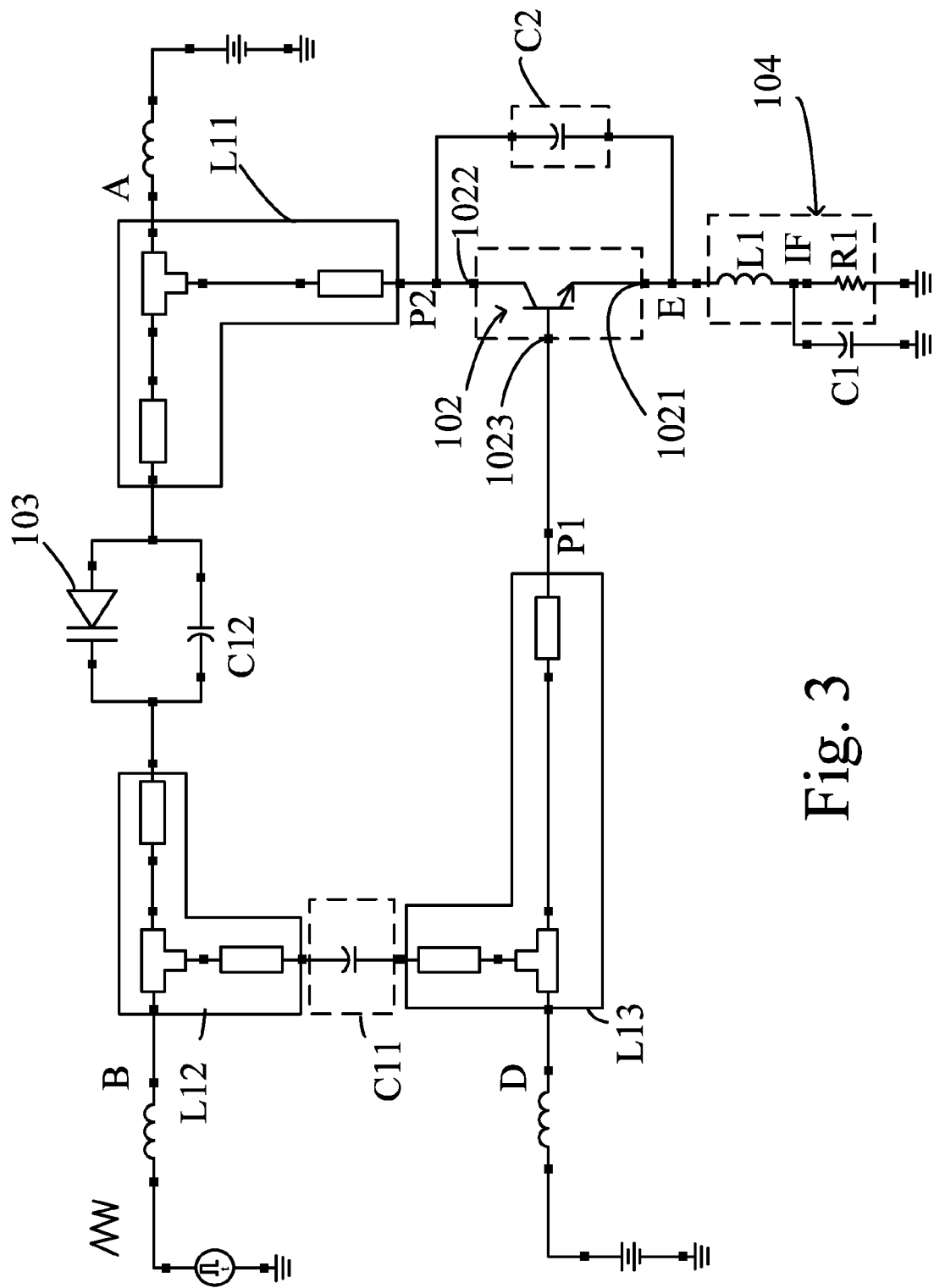
FIG. 3 is a detailed circuit diagram of the active antenna module according to the present invention.

Please refer to FIG. 3, FIG. 3 is a detailed circuit diagram of the active antenna module 100 according to the present invention. The active antenna module 100, having a self-mixing and self-demodulation architecture, comprises a first inductor L11, a second inductor L12, a third inductor L13, a bypass capacitor C2, a first coupling capacitor C11, a second coupling capacitor C12, a radio frequency transistor 102, and a varactor 103. The radio frequency transistor 102 has a control port 1023, a first port 1021, and a second port 1022. Each of the first port 1021 and the second port 1022 is connected to one of two ends of the bypass capacitor C2. The first port 1021 is a port for down conversion that is used as the output terminal for an intermediate frequency (baseband) demodulation signal. The varactor 103 and the second coupling capacitor C12 are connected in parallel. Two ends of the radio frequency transistor 102 are P1 end and P2 end. The control port 1023 of the radio frequency transistor 102 is electrically connected to the P1 end. The second port 1022 of the radio frequency transistor 102 is electrically connected to the P2 end. The first port 1021 is electrically connected to the second port 1022 via the bypass capacitor C2.

The first port 1021 is electrically connected to a ground terminal via an inductor-resistor (LR) series circuit 104. A bypass capacitor C1 and a resistor R1 of the LR series circuit 104 are connected in parallel. One end of the bypass capacitor C2 is electrically connected to the first port 1021. The other end of the bypass capacitor C2 is electrically connected to the second port 1022. One end of the bypass capacitor C1 is electrically connected to an inductor L1 and the resistor R1 of the LR series circuit 104. The other end of the bypass capacitor C1 is electrically connected to the ground terminal. It is worth noticing that in FIG. 3 there must be a 180-degree phase difference between the P1 end and the P2 end to form a positive feedback circuit so as to obtain good oscillation. In the figure, the radio frequency transistor 102 is represented by a BJT. Actually, the radio frequency transistor 102 may be a FET. Under the circumstances of FET, the radio frequency transistor 102 may be a P-Hemt. When the radio frequency transistor 102 is a BJT, the control port 1023 is a base. The first port 1021, namely the port for down conversion, is an emitter, and the second port 1022 is a collector. When the radio frequency transistor 102 is a FET, the control port 1023 is a gate. The first port 1021, namely the port for down conversion, is a source, and the second port 1022 is a drain.

Figure 4:
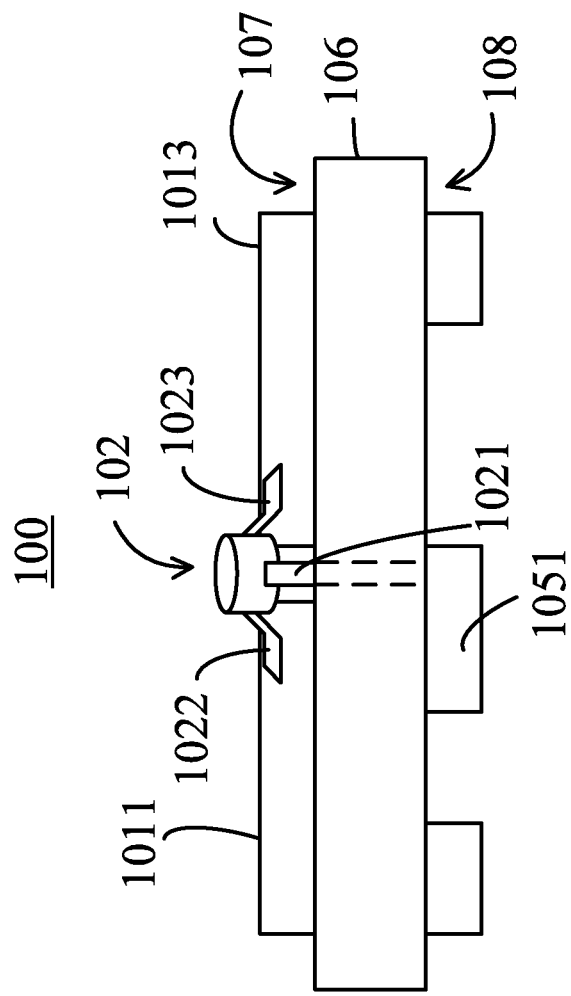
FIG. 4 is a transverse cross-sectional view of a structure of the active antenna module according to the present invention.
Figure 5:
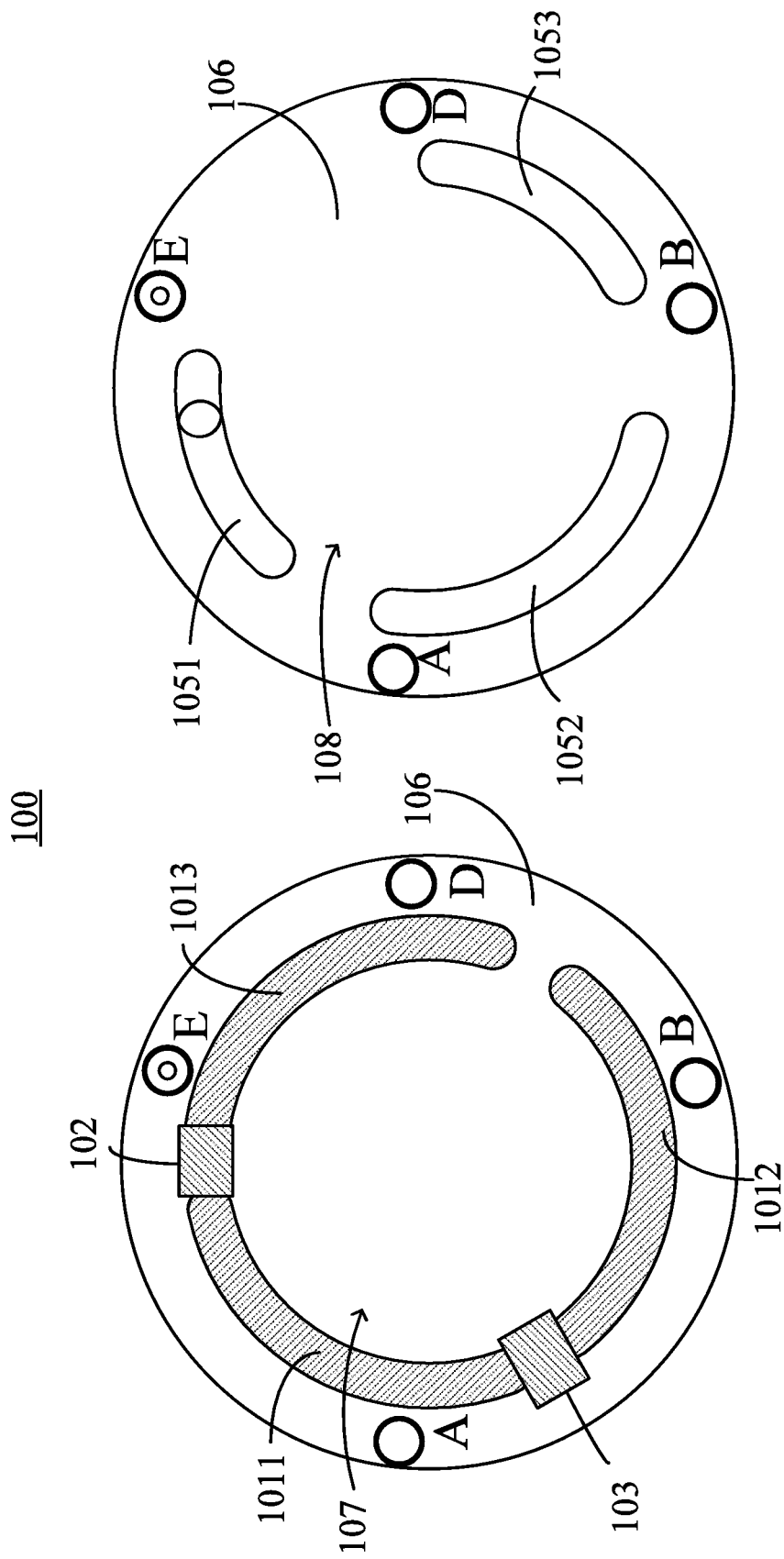
FIG. 5 shows structures on a front side and a back side of the active antenna module of FIG. 4.

Please refer to FIG. 4 and FIG. 5, FIG. 4 is a transverse cross-sectional view of a structure of the active antenna module according to the present invention. FIG. 5 shows structures on a front side and a back side of the active antenna module of FIG. 4. The active antenna module 100 comprises a first microstrip antenna metal sheet 1011, a second microstrip antenna metal sheet 1012, a third microstrip antenna metal sheet 1013, a substrate 106, a radio frequency transistor 102, a first coupling metal sheet 1051, a second coupling metal sheet 1052, and a third coupling metal sheet 1053. The first microstrip antenna metal sheet 1011, the second microstrip antenna metal sheet 1012, and the third microstrip antenna metal sheet 1013 are disposed on a first surface 107 (that is the front side) of the substrate 106. The first coupling metal sheet 1051, the second coupling metal sheet 1052, and the third coupling metal sheet 1053 are disposed on a second surface 108 (that is the back side) of the substrate 106. The first surface 107 and the second surface 108 are opposite faces of the substrate 106. The first microstrip antenna metal sheet 1011, the second microstrip antenna metal sheet 1012, the third microstrip antenna metal sheet 1013, the substrate 106, the first coupling metal sheet 1051, the second coupling metal sheet 1052, and the third coupling metal sheet 1053 constitute the loop antenna 101 shown in FIG. 2. The first microstrip antenna metal sheet 1011, the second microstrip antenna metal sheet 1012, the third microstrip antenna metal sheet 1013, the first coupling metal sheet 1051, the second coupling metal sheet 1052, and the third coupling metal sheet 1053 may be made of copper foils. The first port 1021, the second port 1022, and the control port 1023 of the radio frequency transistor 102 are respectively connected to the first coupling metal sheet 1051, the first microstrip antenna metal sheet 1011, and the third microstrip antenna metal sheet 1013. The first port 1021 is a port for down conversion that is used as the output terminal for an intermediate frequency (baseband) demodulation signal. Through hole A, through hole B, through hole D, and through hole E all penetrate through the substrate 106, and conducting paths are formed by adhering copper foils on the through holes. The through hole A is connected to the first microstrip antenna metal sheet 1011 and is an input terminal of an antenna power signal. That means, the antenna power signal is input from the first microstrip antenna metal sheet 1011 (equivalent to the first inductor L11 shown in FIG. 3). The through hole B is connected to the second microstrip antenna metal sheet 1012 and is an input terminal for a modulation signal. That means, the modulation signal is input from the second microstrip antenna metal sheet 1012 (equivalent to the second inductor L12 shown in FIG. 3), and the modulation signal is a triangular wave or a sine wave. The through hole D is connected to the third microstrip antenna metal sheet 1013 and is an input terminal for a bias voltage for the radio frequency transistor 102. When the radio frequency transistor 102 is a FET, the through hole D may be connected to a constant voltage (may be a ground terminal). The through hole E is connected to the first coupling metal sheet 1051.

The active antenna module 100 further comprises a varactor 103 disposed on the first surface 107. The varactor 103 is connected between first microstrip antenna metal sheet 1011 and the second microstrip antenna metal sheet 1012. The capacitance value of the varactor 103 will change in accordance with the voltage applied across its two ends. The varactor 103 is used for tuning a FM signal when the active antenna module 100 is applied to the FM tuner or the FM modulation circuit.

Figure 6:
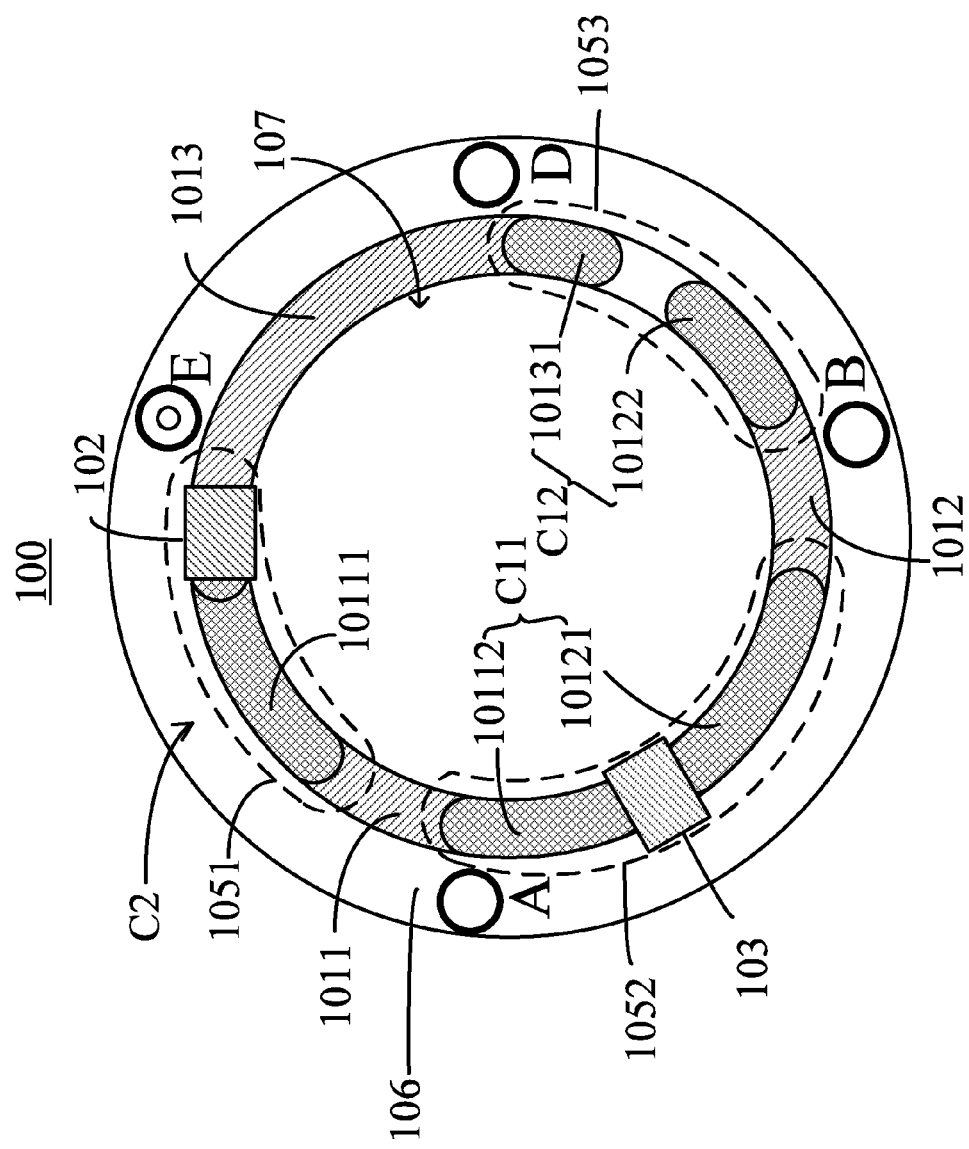
FIG. 6 is a front view of the structure of the active antenna module of FIG. 4.

Please refer to FIG. 6, FIG. 6 is a front view of the structure of the active antenna module of FIG. 4. A first portion 10111 of the first microstrip antenna metal sheet 1011 overlaps with the first coupling metal sheet 1051 to form a bypass capacitor C2. A second portion 10112 of the first microstrip antenna metal sheet 1011 and a first portion 10121 of the second microstrip antenna metal sheet 1012 adjacent to the second portion 10112 of the first microstrip antenna metal sheet 1011 overlap with the second coupling metal sheet 1052 to form a first coupling capacitor C11. The first microstrip antenna metal sheet 1011 is approximately in an arc shape, and the first portion 10111 and the second portion 10112 are located at both ends of the arcuate structure. A second portion 10122 of the second microstrip antenna metal sheet 1012 and a first portion 10131 of the third microstrip antenna metal sheet 1013 adjacent to the second portion 10122 of the second microstrip antenna metal sheet 1012 overlap with the third coupling metal sheet 1053 to form a second coupling capacitor C12. The second microstrip antenna metal sheet 1012 is approximately in an arc shape, and the first portion 10121 and the second portion 10122 are located at both ends of the arcuate structure. The radio frequency transistor 102 is disposed on the first surface 107. The control port 1023 of the radio frequency transistor 102 is connected to the third microstrip antenna metal sheet 1013 so as to electrically connect the loop antenna 101 (please also refer to FIG. 2).

The loop antenna 101, when designing, must be analyzed through experimental verification. In other words, the present invention active antenna module 100 is transformed into the dual-port circuit shown in FIG. 2. Please also refer to FIG. 6, the circumference of the planar loop antenna 101 is approximately one half of the radio frequency wavelength ($\lambda/2=2\pi r$). Since the diameter measured from the outer margin of the first micro strip antenna metal sheet 1011, the second microstrip antenna metal sheet 1012, and the third microstrip antenna metal sheet 1013 on the front side is 17.1 mm, the frequency should be higher than 2.79 GHz. However, as shown by the structure of FIG. 6, the copper foils on the back side are equivalent to metal coupling capacitors. Hence, the equivalent length of the LC tank is greater than the circumference, which is $17.1\pi$ (mm), to allow the antenna frequency be reduced to below 2.79 GHz. Furthermore, the phase of the radio frequency transistor 102 is controlled. When the phase delays inherently existing between the drain and the gate or the collector and the base of the radio frequency transistor 102 combine with the phase delay of the antenna at operating frequency to make up the phase delay required by a positive feedback (180°), the optimized oscillation condition is achieved. Thus, as indicated by the experimental test result, the oscillation frequency is 2.3-2.4 GHz when AT41486 transistor is utilized as the oscillator. The oscillation frequency is 2.0-2.1 GHz when BFR92 transistor is utilized as the oscillator. The combinations of metal coupling capacitors and various transistors would therefore reduce the oscillation frequency of the antenna having its original size from 2.79 GHz to 2.0-2.1 GHz. As a result, the antenna size is shrunk to miniaturize the antenna.

It is worth noticing that the stability of the loop antenna 101 will be affected when adjusting the metal coupling capacitors. Take the BJT utilized as the radio frequency transistor 102 as an example, the lower the capacitance value of the equivalent metal coupling capacitor that is used as the bypass capacitor C2 is, the lower the internal impedance of the radio frequency transistor 102 is to increase the base current $I_B$, based on simple small-signal model equation of BJT. The increased base current $I_B$ will cause the collector current $I_C$ increase. Hence, the spectrum stability of the loop antenna 101 caused by radio frequency oscillation is improved. Furthermore, in the design shown in FIG. 2, the magnitude of the current must be considered when designing the oscillating sensor to ensure good operation. That means, the base current $I_B$, the emitting current $I_E$, and the collector current $I_C$ must be considered when the radio frequency transistor 102 is a BJT. But when the radio frequency transistor 102 is a FET, the gate voltage $V_G$, the source current $I_S$, and the drain current $I_D$ must be considered. For example, special attention should be paid to the design because the emitting current $I_E$ decides the radiation signal strength and consequently affects the sensing distance directly. It is understandable that the operating point of the oscillator may be decided by the bias voltage. Theoretical value is very easy to find, but the optimized point must be obtained by experimental verification. The optimized point is found from the conditions having a signal to noise (S/N) ratio higher than the required S/N ratio.

In this structure, the desired equivalent inductance value and the desired equivalent capacitance value are achieved by selecting the first microstrip antenna metal sheet 1011, the second microstrip antenna metal sheet 1012, the third microstrip antenna metal sheet 1013, the first coupling metal sheet 1051, the second coupling metal sheet 1052, and the third coupling metal sheet 1053. As mentioned previously, by designing the lengths of the metal coupling capacitors, the operating frequency of the loop antenna 101 is adjusted toward the lower frequency. In other words, the equivalent length for the half wavelength ($\lambda g/2$) is elongated. In addition, the operating point of the radio frequency transistor 102 is adjusted to compensate the inadequate phase. Finally, the first microstrip antenna metal sheet 1011, the second microstrip antenna metal sheet 1012, the third microstrip antenna metal sheet 1013, the first coupling metal sheet 1051, the second coupling metal sheet 1052, and the third coupling metal sheet 1053 are designed in a manner so that they are used as the resonator when the radio frequency transistor 102 resonates.

Please refer to FIG. 2 and FIG. 3 again, the operating frequency of the present invention loop antenna 101 is decided by the inductance value L of the loop antenna 101 (relevant to the lengths of the first microstrip antenna metal sheet 1011, the second microstrip antenna metal sheet 1012, and the third microstrip antenna metal sheet 1013) and the capacitance value C contributed by the bypass capacitor C2, the first coupling capacitor C11, and the second coupling capacitor C12 (relevant to the lengths of the bypass capacitor C2, the first coupling capacitor C11, and the second coupling capacitor C12). The larger the LC value is, the lower the radio frequency oscillation frequency is. Conversely, the smaller the LC value is, the higher the radio frequency oscillation frequency is. However, it is worth noticing that the radio frequency stability is closely related to the selection of the coupling capacitor and the bypass capacitor. When the radio frequency transistor 102 is a BJT, according to the simple small-signal model equation $I_C=\beta I_B$, the smaller the capacitance value of the bypass capacitor C2, the lower the internal impedance of the radio frequency transistor 102 is to cause the $\beta$ value increase. That means, the collector current $I_C$ is increased to improve the radio frequency stability of the loop antenna 101. When the radio frequency transistor 102 is a FET, the simple small-signal model equation of FET is as follows:

$$I_D = I_{DSS}\left(1 - \frac{V_{GS}}{V_P}\right)^2,$$

where $V_P$ is the pinch-off voltage, $V_{GS}$ is the gate-source voltage, $I_{DSS}$ is the drain-source saturation current. The smaller the capacitance value of the bypass capacitor C2 is, the lower the internal impedance $r_{DS}$ of the radio frequency transistor 102 is. Since $V_{DS}=r_{DS} \times I_D$, the current $I_D$ is relatively increased under the circumstances of constant input voltage (the drain-source voltage $V_{DS}$ is a constant value).

In summary, in this circuit design, the lower the capacitance values of the bypass capacitors C2 is, the more stable the radio frequency oscillation is. That is, on the frequency spectrum distribution, the harmonic energy is decreased but the domain energy is increased. Conversely, the higher the capacitance values of the bypass capacitors C2 is, the less stable the radio frequency oscillation is. That is, on the frequency spectrum distribution, the harmonic energy is increased but the domain energy is decreased. As for the coupling capacitors C11, C12, their effects are just opposite to that of the bypass capacitor C2. The higher the capacitance values of the coupling capacitors C11, C12 are, the more stable the system is. That is, on the frequency spectrum distribution, the harmonic energy is decreased but the domain energy is increased. Conversely, the lower the capacitance values of the coupling capacitors C11, C12 are, the less stable the system is. That is, on the frequency spectrum distribution, the harmonic energy is increased but the domain energy is decreased.

When actually adjusting the loop antenna 101, the adjustment can be divided into coarse tuning and fine tuning. Coarse tuning means to cut the first and second coupling capacitors C11, C12 and the bypass capacitor C2 on the second surface 108 of the substrate 106. However, not matter which of the first coupling capacitor C11, the second coupling capacitors C12, and the bypass capacitor C2 is cut, the radio frequency center frequency is increased, and the rate of increase is large, approximately 50M-500 MHz. When the radio frequency transistor 102 is a FET, to cut and reduce the bypass capacitor C2 will increase the drain-to-source gain of the radio frequency transistor 102. Hence, the radio frequency stability is improved but relatively the oscillation sensibility is reduced. When cutting and reducing the first coupling capacitor C11 or the second coupling capacitor C12, the impedance value at the drain of the radio frequency transistor 102 is reduced. Hence, the drain-to-source gain is reduced to deteriorate the stability of radio frequency circuit, but relatively the sensibility is improved.

Fine tuning means to change the power resistor $R_D$ coupled to the drain of the radio frequency transistor 102 or the bias resistor $R_S$ coupled to the source of the radio frequency transistor 102. When the power resistor $R_D$ or the bias resistor $R_S$ is changed, the radio frequency center frequency will change slightly, approximately ±50 MHz. In general, when the resistance value is increased, the radio frequency center frequency will increase slightly. When the resistance value is decreased, the radio frequency center frequency will decrease slightly. To decrease the resistance value of the power resistor $R_D$ will increase the radio frequency transmitting power (that is to increase the drain current $I_D$ of the radio frequency transistor 102), and the signal amplitude therefore becomes larger.

When the structure of the equivalent model shown in FIG. 2 is compared with a standard radar structure, metal (or copper foil) on the front side and metal (or copper foil) on the back side are equivalent to the loop antenna structure if it is equivalent to a standard radar antenna. In addition, when it is used as a voltage controlled oscillator, the loop antenna and the metal stripes are respectively equivalent to the equivalent inductor (L) and the equivalent capacitor (C), and together constitute the resonant cavity of the transistor. In the present invention active antenna module 100, the radio frequency transistor 102 also has the functions of the voltage controlled oscillator and the mixer. The first microstrip antenna metal sheet 1011, the second microstrip antenna metal sheet 1012, the third microstrip antenna metal sheet 1013, the first coupling metal sheet 1051, the second coupling metal sheet 1052, and the third coupling metal sheet 1053 are designed in a manner so that they are used as the resonator when the radio frequency transistor 102 resonates. When it is used as the mixer, the bias voltage applied to the base is utilized for driving the radio frequency transistor 102 to operate near the saturation region so as to detect the intermediate frequency signal at the emitter.

In summary, the present invention radio frequency sensor structure sufficiently resolves the problems of prior art, and is very ideal when applying to small-sized sensors used for measuring moving objects at a short distance but having a wide coverage angle. Since the radio frequency module and the antenna of the radio frequency sensor structure are integrated together, the antenna therefore has the functions of the oscillator and the feedback circuit to simplify the radio frequency transceiver. Furthermore, the voltage controlled oscillator and the mixer are replaced by a BJT or a FET (for example: P-Hemt), both volume and power consumption rate are obviously improved. Moreover, the design approach of the present invention is to take advantage of the high sensitivity rather than designing the traditional radar antenna system having high gain and high power, so the electromagnetic radiation power is reduced, and may be less than −10 dB. The interferences to other communication and radar systems are thus low. In addition, since the antenna is integrated with the radio frequency circuit comprising the oscillating circuit and the mixing and demodulation circuit, at least one active component such as a radio frequency transistor must be disposed on the antenna. Hence, the length of the radio frequency oscillation loop is compensated by adjusting the phase of the radio frequency transistor to allow the frequency unchanged when the antenna size is shrunk. At the same time, the operating frequency is maintained within the low frequency band so the 3 dB beamwidth is not made small, which is appropriate to the detection of moving objects having a wide coverage angle.

Those skilled in the art will readily observe that numerous modifications and alterations of the device and method may be made while retaining the teachings of the invention. Accordingly, the above disclosure should be construed as limited only by the metes and bounds of the appended claims.

We claim:

1. An active antenna module, comprising:
   a substrate comprising a first surface and a second surface opposite to the first surface;
   a first microstrip antenna metal sheet disposed on the first surface of the substrate;
   a second microstrip antenna metal sheet disposed on the first surface of the substrate;
   a third microstrip antenna metal sheet disposed on the first surface of the substrate;

a first coupling metal sheet disposed on the second surface;

a second coupling metal sheet disposed on the second surface;

a third coupling metal sheet disposed on the second surface; and a radio frequency transistor disposed on the first surface, the radio frequency transistor comprising a control port, a first port, and a second port, the control port being connected to the third microstrip antenna metal sheet, and the first port and the second port being respectively connected to the first coupling metal sheet and the first microstrip antenna metal sheet;

wherein a first portion of the first microstrip antenna metal sheet and the first coupling metal sheet form an equivalent bypass capacitor, a second portion of the first microstrip antenna metal sheet, a first portion of the second microstrip antenna metal sheet adjacent to the second portion of the first microstrip antenna metal sheet, and the second coupling metal sheet form a first equivalent coupling capacitor, a second portion of the second microstrip antenna metal sheet, and portions of the third microstrip antenna metal sheet adjacent to the second portion of the second microstrip antenna metal sheet, and the third coupling metal sheet form a second equivalent coupling capacitor.

2. The active antenna module as claimed in claim 1, wherein the first microstrip antenna metal sheet, the second microstrip antenna metal sheet, the third microstrip antenna metal sheet, the first coupling metal sheet, the second coupling metal sheet, and the third coupling metal sheet constitute a loop antenna.

3. The active antenna module as claimed in claim 1, wherein the radio frequency transistor is a bipolar junction transistor.

4. The active antenna module as claimed in claim 3, wherein the control port is a base, the first port is an emitter, and the second port is a collector.

5. The active antenna module as claimed in claim 1, wherein radio frequency transistor is a field effect transistor, and the field effect transistor comprises a pseudomorphic high electron mobility transistor.

6. The active antenna module as claimed in claim 5, wherein the control port is a gate, the first port is a source, and the second port is a drain.

7. The active antenna module as claimed in claim 1 further comprising a varactor disposed on the first surface and electrically connected between the first microstrip antenna metal sheet and the second microstrip antenna metal sheet.

8. An active antenna module, comprising:
a first inductor;
a second inductor;
a third inductor;
a first bypass capacitor;
a first coupling capacitor;
a second coupling capacitor, the first inductor, the first bypass capacitor, the third inductor, the first coupling capacitor, the second inductor, and the second coupling capacitor sequentially connecting to form a loop;
a radio frequency transistor, the radio frequency transistor comprising a control port, a first port, and a second port, one end of the first bypass capacitor being electrically connected to the second port, the other end of the first bypass capacitor being electrically connected to the first port, and the control port and the second port being out of phase;
an inductor-resistor series circuit, the first port being electrically connected to a ground terminal via the inductor-resistor series circuit; and
a second bypass capacitor, the second bypass capacitor and a resistor of the inductor-resistor series circuit being connected in parallel.

9. The active antenna module as claimed in claim 8, wherein the radio frequency transistor is a bipolar junction transistor.

10. The active antenna module as claimed in claim 9, wherein the control port is a base, the first port is an emitter, and the second port is a collector.

11. The active antenna module as claimed in claim 8 further comprising a varactor electrically connected to the second coupling capacitor in parallel.

12. The active antenna module as claimed in claim 8, wherein the radio frequency transistor is a field effect transistor, and the field effect transistor comprises a pseudomorphic high electron mobility transistor.

13. The active antenna module as claimed in claim 12, wherein the control port is a gate, the first port is a source, and the second port is a drain.

14. The active antenna module as claimed in claim 12, wherein a bias voltage is coupled to the FET via the third inductor.

15. The active antenna module as claimed in claim 8, wherein the first port is a port for down conversion used for outputting a demodulation signal.

16. The active antenna module as claimed in claim 8, wherein the second bypass capacitor is coupled between the resistor of the inductor-resistor series circuit and the ground terminal.

17. The active antenna module as claimed in claim 8, wherein an antenna power signal is supplied via the first inductor.

18. The active antenna module as claimed in claim 8, wherein a modulation signal in form of a triangular wave or a sine wave is inputted via the second inductor.

* * * * *